United States Patent [19]

Riedl

[11] Patent Number: 5,602,434
[45] Date of Patent: Feb. 11, 1997

[54] PULSE CONTROLLED MOTION CONVERSION SYSTEM FOR MAGNETOSTRICTIVE MOTOR

[75] Inventor: Harold R. Riedl, Adelphi, Md.

[73] Assignee: The United States of America as represented by the Secretary of the Navy, Washington, D.C.

[21] Appl. No.: 414,884

[22] Filed: Mar. 31, 1995

[51] Int. Cl.$^6$ .............................. H02K 41/06; H02K 7/06
[52] U.S. Cl. .................................. 310/26; 310/83
[58] Field of Search .................... 310/26, 20, 46, 310/37, 83, 328; 318/118, 135; 335/215

[56] References Cited

U.S. PATENT DOCUMENTS 5,231,887  8/1993  Arvidsson et al. ..................... 74/88
5,341,056  8/1994  Maccabee ............................. 310/26
5,357,232  10/1994  Suzuki et al. ....................... 335/215
5,382,863  1/1995  Tyrén ................................. 310/328

Primary Examiner—Steven L. Stephan
Assistant Examiner—Judson H. Jones
Attorney, Agent, or Firm—John Forrest; Jacob Shuster

[57]  ABSTRACT

Axial elongation of a magnetostrictive element during a power phase of operation in a motor, effects conversion of axial force to a torque applied to a rotor through cam discs held in axial engagement by a clutch disc during axial force transfer. Rotor rotation by such torque angularly displaces the cam discs relative to each other against the bias of a spring device during the power phase, followed by a freewheeling phase during which axial withdrawal of the clutch disc occurs in response to contraction of the magnetostrictive element and angular restoration of the cam discs to a limit position under the spring bias.

7 Claims, 3 Drawing Sheets

PULSE CONTROLLED MOTION CONVERSION SYSTEM FOR MAGNETOSTRICTIVE MOTOR

This invention relates generally to magnetostrictive motors and more particularly to a motion converting mechanism in association therewith.

BACKGROUND OF THE INVENTION

Motors or actuator within which a terbium/iron alloy (known as Terfenol) exhibits large magnetostrictive effects in the presence of a magnetic field, are generally well known in the art. An actuator device embodying a Terfenol rod that is magnetostrictively deformed in length by magnetic field pulsations applied through a surrounding coil, is disclosed for example in U.S. Pat. No. 5,231,887 to Arvidsson et al. A magnetostrictive type of motor system having a unidirectionally driven rotor is disclosed in U.S. Pat. No. 5,341,056 to Maccabee, wherein plural Terfenol rods with activating magnetic coils are utilized. Some of such rods are magnetostrictively deformed into engagement with the rotor, intermittently, while being continuously engaged with other of such rods, all of which are also engaged with a reaction frame. U.S. Pat. No. 5,357,232 to Suzuki et al. is of interest in disclosing a magnetostrictive element having a Terfenol rod coaxially positioned within a hollow magnet to which it is coupled by a soft magnetic yoke to form a closed magnetic circuit therewith. U.S. Pat. No. 5,382,863 to Tyren is also of interest in disclosing a Terfenol rod that is deformed in one direction by a magnetic field causing a magnetostrictive change.

It is an important object of the present invention to provide a magnetostrictive type of motor system capable of operation under a wide range of speed and torque by control of an alternating electrical input so as to accommodate many different loading applications, including for example applications requiring a high start-up torque.

Additional objects of the invention in accordance with the foregoing object is to provide a magnetostrictive motor system capable of rapid delivery of high torques to a load as well as to accommodate lower load requirements without drive ratio control of gearing or the like.

Other objects include the provision of a magnetostrictive motor that is readily adjusted, and has simple repair, maintenance and check-up capabilities.

SUMMARY OF THE INVENTION

In accordance with the present invention, a magnetostrictive element is adjustably positioned within a lubricant filled motor casing surrounded by a winding coil to which pulsating electrical current is supplied under selective control for generating a varying magnetic field within the motor casing causing cyclic axial deformation of the magnetostrictive element. Forces accompanying axial elongation of the magnetostrictive element are transferred by a clutch disc to a force transmitting cam disc thereby displaced into engagement with a cam disc fixed to a driven rotor. Axial transmission of force from the clutch disc and conversion thereof into rotor imparted torque dependent on pitch and shape of engaging cam surfaces on the cam discs is thereby achieved under control of current pulses conducted through the magnetic field producing winding coil. A spring device yieldably resists angular displacement of the force transmitting cam disc from a limit position relative to the rotor during which torque is imparted to the rotor which thereby acquires rotational momentum. The spring device restores the force transmitting cam disc to the limit position for a freewheeling phase of operation during which the cam discs are axially disengaged so that they continue to rotate under rotor momentum produced during a preceding power phase.

BRIEF DESCRIPTION OF THE DRAWING FIGURES

A more complete appreciation of the invention and many of its attendant advantages will be readily appreciated as the same becomes better understood by reference to the following detailed description when considered in connection with the accompanying drawings wherein.

DETAILED DESCRIPTION OF PREFERRED EMBODIMENTS

Figure 1:
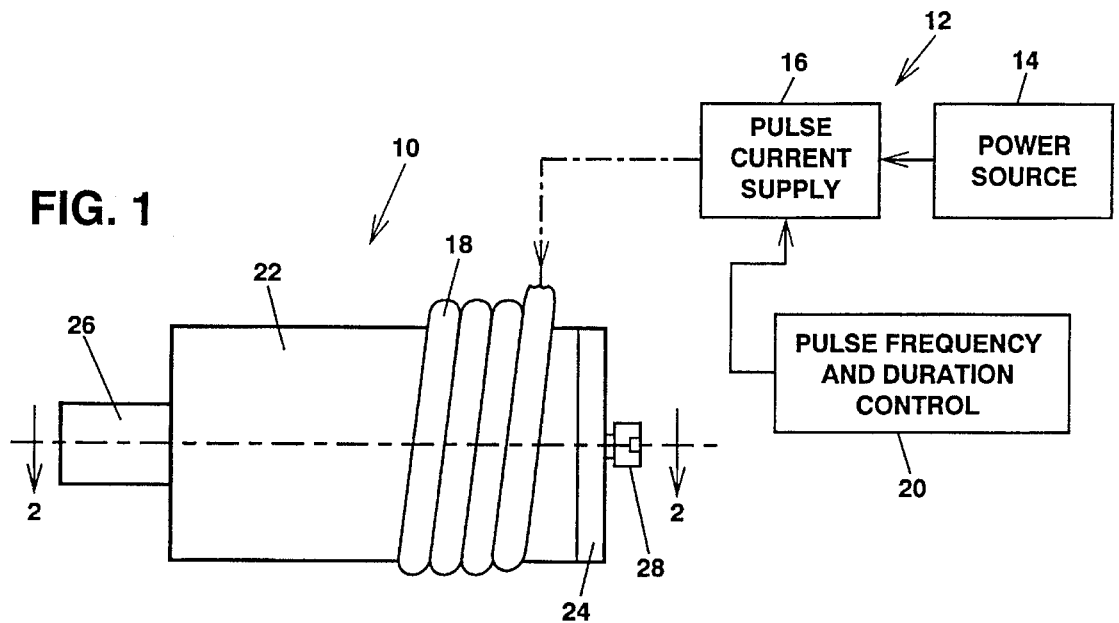
FIG. 1 is side elevation view of a magnetostrictive motor constructed in accordance with one embodiment of the invention, in association with a schematically diagrammed power supply system.

Referring now to the drawing in detail, FIG. 1 illustrates a magnetostrictive motor, generally referred to by reference numeral 10, to which electrical energy is supplied from a pulse current supply system generally referred to by reference numeral 12. As schematically diagrammed in FIG. 1, the pulse current supply system 12 includes an electrical power source 14 from which pulse current supply 16 delivers electrical energy to a magnetic field generating coil 18 associated with the motor 10, in accordance with frequency and pulse duration control by component 20. In such illustrated embodiment, the coil 18 is wound on the outer cylindrical surface of motor casing 22, closer to one axial end thereof closed by a removable cap 24. A rotor shaft 26 projects axially from the other axial end of the casing 22, opposite the cap 24 from which an adjustment screw head 28 projects.

Figure 2:
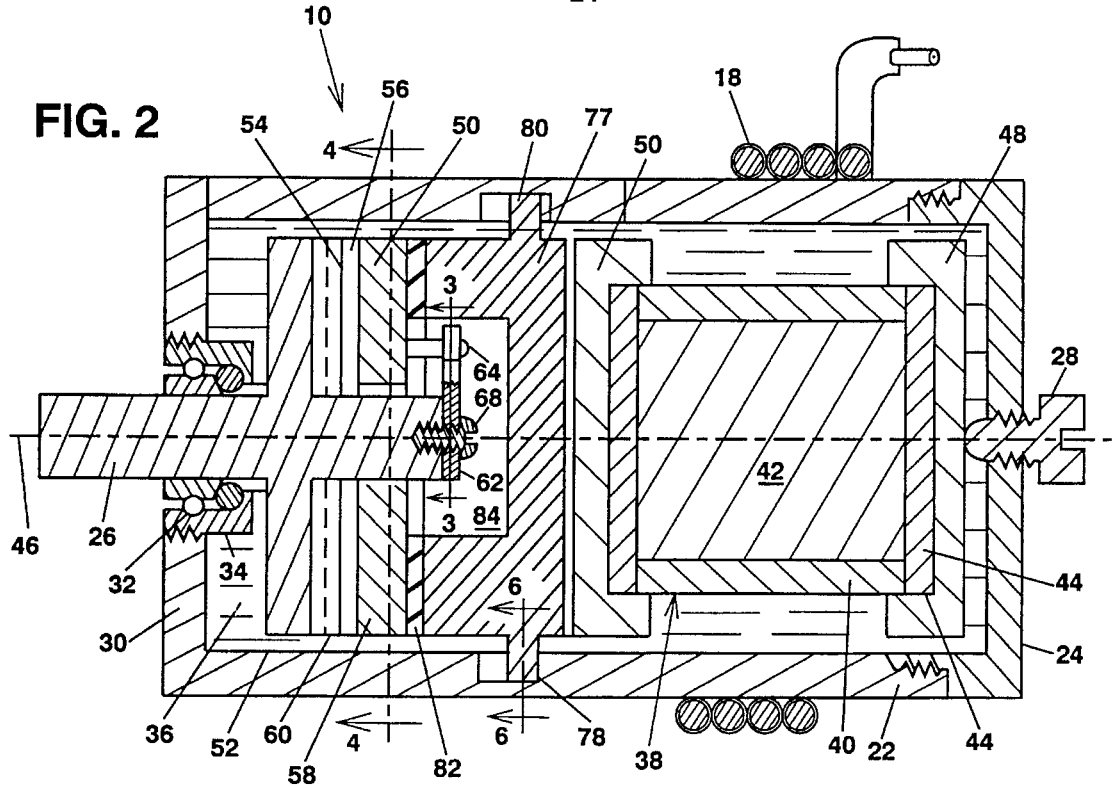
FIG. 2 is an enlarged side section view of the motor shown in FIG. 1, taken substantially through a plane indicated by section line 2—2.

As shown in FIG. 2, the cylindrical motor casing 22 threadedly receives the cap 24 at the axial end thereof opposite an end wall 30 from which the rotor shaft 26 projects through a shaft bearing 32. A suitable seal 34 is provided at the bearing 32 to prevent outflow of lubricant oil 36 filling the cavity enclosed by the casing 22 between end cap 24 and end wall 30.

With continued reference to FIG. 2, a magnetostrictive element generally referred to by reference numeral 38, is disposed in the oil filled cavity of casing 22 so as to be operatively positioned within an alternating magnetic field produced therein by the pulse current carrying coil 18. In the embodiment shown in FIG. 2, the magnetostrictive element 38 includes a hollow cylindrical rod 40 made of Terfenol.

Such magnetostrictive rod is mounted in coaxial relation on a permanent magnet 42 magnetically biasing rod 40 into a more efficient operating condition pursuant to a technique generally known in the art. Thus, a magnetic coupling is established between the inner magnet 42 and the magnetostrictive rod 40 by soft yokes 44 at opposite axial ends of the element 38, which is held in axial alignment with rotor shaft 26 along its rotational axis or centerline 46 by end plates 48 and 50. The axial position of the magnetostrictive element 38 within the casing 22 is adjusted through screw head 28 abutting the axial end plate 48. Such adjustment is made for operational alignment and/or synchronization of a motion converting mechanism located within the casing 22 between the end plate 50 and the end wall 30.

The motion converting mechanism as shown in FIG. 2 includes a cam disc 52 fixed to the rotor shaft within the casing 22 adjacent to end wall 30. Cam surface 54 on the cam disc 52 rotates with and is axially fixed on the rotor shaft. A cam surface 56 is also provided on a force transmitting cam disc 58 axially engageable with the cam surface 54 so as to apply torque to the rotor shaft 26 through the cam disc 52. The cam disc 58 is therefore axially as well as angularly displaceable relative to the rotor cam disc 52. The rotor shaft 26 extends axially through a central bore 60 in the cam disc 58 and terminates at an inner axial end 62, as shown in FIG. 2. At such inner axial end 62, the rotor shaft is yieldably coupled to the cam disc 58 by a spring device 64.

Figure 3:
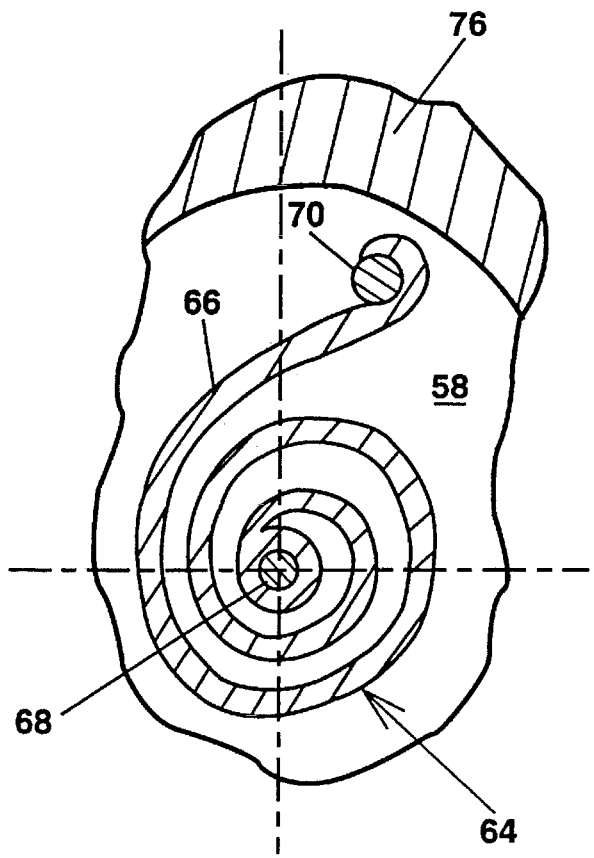
FIG. 3 is an enlarged partial section taken substantially through a plane indicated by section line 3—3 in FIG. 2.
Figure 4:
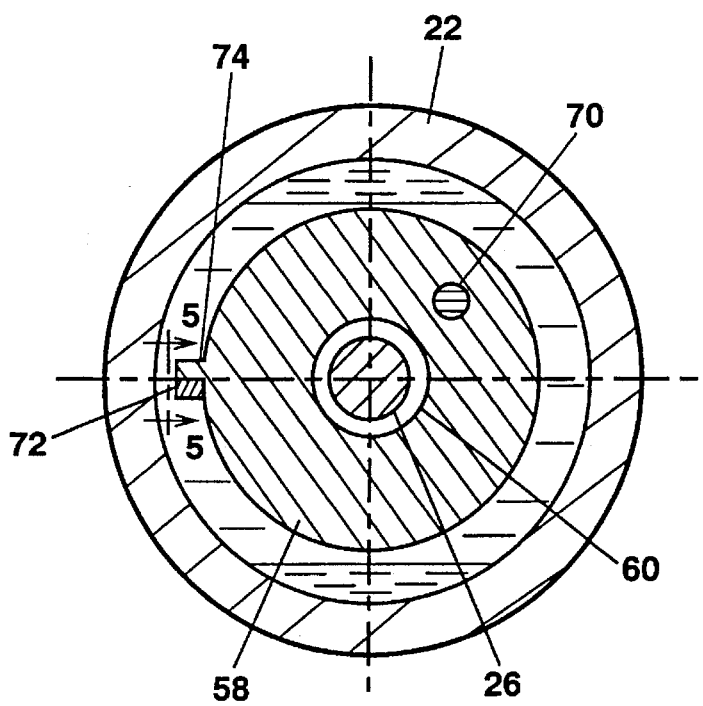
FIG. 4 is a transverse section view taken substantially through a plane indicated by section line 4—4 in FIG. 2.
Figure 5:
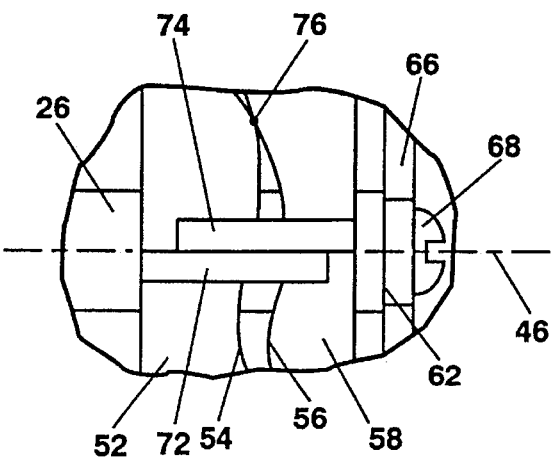
FIG. 5 is an enlarged partial view from a plane indicated by section line 5—5 in FIG. 4.

Referring now to FIGS. 2 and 3, the spring device 64 includes a spiral spring element 66 attached at its radially inner end by screw fastener 68 to the inner axial end 62 of the rotor shaft. The radially outer end of the spring element 66 is attached by a pin 70 to the cam disc 58. The spring element 66 thereby angularly biases the cam discs relative to each other to a limit position in which stop projections 72 and 74 on the cam discs, abut each other as shown in FIGS. 4 and 5. The abutting stop elements 72 and 74 extend from the cam discs in axially overlapping relation to each other as more clearly seen in FIG. 5. In such limit position of the cam discs relative to each other, the cam disc 58 is maintained in axial engagement with the axially fixed cam disc 52 under an axial force. Such axial force is transmitted at radially extending contact lines 76 on the engaging cam surfaces 54 and 56. The transmitted forces therefore have components at right angles to and radially spaced from the rotor axis 46 so as to produce a torque on the rotor shaft dependent on the magnitude of the axial force exerted on the cam disc 58 and the slope of the cam surfaces at the contact lines 76.

Figure 6:
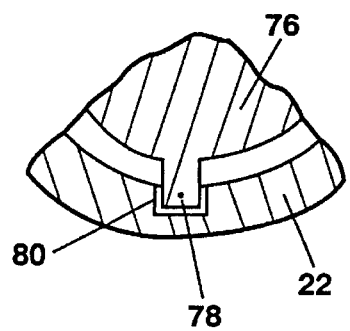
FIG. 6 is an enlarged partial section view taken substantially through a plane indicated by section line 6—6 in FIG. 2.

Axial forces generated by the magnetostrictive element 38 in response to electrical pulse current conducted through the winding coil 18, are transmitted through a clutch disc 77 to the force transmitting cam disc 58. The clutch disc 77 is positioned in axial alignment between the magnetostrictive element 38 and the cam disc 58 as shown in FIG. 2 so as to be engaged and receive axial forces on one axial side from the end plate 50 of element 38 causing displacement of the clutch disc 77 which is confined to axial movement by radial projections 78 received in axially extending grooves 80 within the casing 22, as shown in FIGS. 2 and 6. A frictional interface 82 is mounted on an annular portion of the clutch disc 77 at the axial side thereof adjacent the cam disc 58 for engagement therewith in response to the axial forces transmitted. The annular portion of the clutch disc 77 encloses an internal space 84 within which the inner end 62 of the rotor shaft and the spring device 64 are located.

In response to axial forces transmitted to the clutch disc 77 as a result of axial expansion of magnetostrictive element 38, the annular frictional interface 82 is pressurized by engagement with the cam disc 58 so as to apply such axial forces thereto thereby imparting rotation inducing torque to the rotor shaft through the sliding cam surfaces 54 and 56 on the cam discs 58 and 52 as hereinbefore described. During such application of axial forces by the pressurized interface 82, rotation of the force transmitting cam disc 58 is prevented by the non-rotatable clutch disc 77. Rotation of the rotor shaft and cam disc 52 by the torque imparted thereto, will accordingly cause separation of the stop formations 72 and 74 and stressing of the spring device 64 yieldably resisting the relative rotation of the cam discs from the limit position. The rotor shaft and cam disc 52 will continue to rotate by momentum as the clutch interface 82 is subsequently axially withdrawn and depressurized during a free-wheeling phase of operation after axial contraction of the magnetostrictive element 38.

Figure 7:
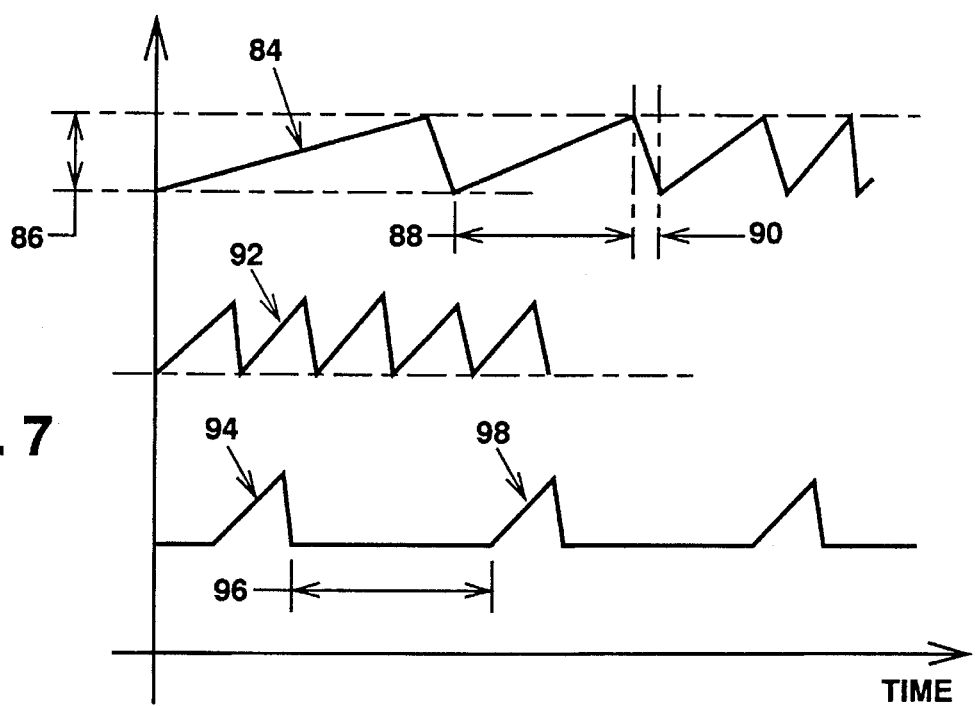
FIG. 7 is a graphical diagram of pulse currents associated with the power supply system diagrammed in FIG. 1.

Control over the power and free-wheeling phases of each operational cycle of the motor 10 as hereinbefore referred to, is effected through the pulse frequency and duration control component 20 of the pulse current supply system 12 diagrammed in FIG. 1. According to one embodiment of the invention, the control component 20 produces a cyclic operational mode wherein both pulse frequency and pulse wave shape are variable during the power phase. According to such operational mode, motor start-up current 84 is fed to the winding coil 18, graphically shown in FIG. 7 maintained at a constant pulse amplitude 86. The rise time 88 for each current pulse is much longer than its decay time 90. Also, the current 84 has pulses of progressively decreasing duration as shown in FIG. 7. For start-up under heavy load, the pulse wave shape of the current 84 as diagrammed in FIG. 7 is probably most appropriate.

After attaining a predetermined operational motor speed following start-up, the pulse wave shape of the winding coil current changes to that of current 92, as diagrammed in FIG. 7, in order to exert torque producing force continuously during repeated power cycles.

Also graphically diagrammed in FIG. 7 is winding coil current 94 fed to the winding coil 18 of the motor 10 during a free-wheeling phase of operation having a pulse wave shape utilized in low drag situations. The current 94 has a pulse amplitude substantially the same as that of the power phase currents 84 and 92 and a pulse duration substantially the same as the pulses of current 92 or the last pulse of the current 84 during the power phase. The pulse wave shape of free-wheeling current 94 is however provided with a cycle dead time period 96 between pulse formations 98 as shown. During each of such dead time periods 96 no forces are transmitted through the cam discs 58 and 52. Rotation of the rotor shaft 26 is however continued under the rotational momentum induced by torque imparted during a preceding power phase of operation.

Alignment and synchronization of the motor 10 is performed by supply of current to coil 18 under selective control of component 20 to produce a steady magnetic field of a magnitude somewhat greater than the peak value of the alternating field produced during the power phase of motor operation. The adjustment screw 28 is then tightened so as to bottom out all parts within the motor housing 22.

In summary, operation of the motor 10 is effected by supply of electrical pulse energy to the winding coil 18 in the motor housing 22 during power phases to cause axial elongation of the magnetostrictive element 38 thereby applying axial force to non-rotatable clutch disc 77. The axial force is transferred from the clutch disc 77 by its frictional interface 82 to the force transmitting cam disc 58 causing engagement of its cam surface 56 with the cam surface 54 on the rotor cam disc 52. Torque is thereby imparted to the cam disc 52 causing unidirectional angular movement of the rotor shaft from an angular limit position determined by cam disc projections 72 and 74. Rotation so imparted to the rotor shaft causes separation of the stop projections and stressing of spring device 64 interconnected between the rotor shaft and the force transmitting cam disc 58 to yieldably resist angular displacement during power pulses and bias return of the cam discs to the limit position between power pulses. Upon completion of a power phase of operation, the rotor shaft 26 continues to rotate under angular momentum induced by the rotational torque previously imparted thereto as the magnetostrictive element 38 is axially contracted during an ensuing free-wheeling phase of operation. The clutch disc 77 is thereby axially disengaged from the force transmitting cam disc 58 during the free-wheeling phase. The cam discs 58 and 52 are restored to the limit position under the bias of spring device 64, but continue to rotate together under angular momentum of the rotor with reducing speed until the next power phase is initiated.

Obviously, other modifications and variations of the present invention may be possible in light of the foregoing teachings. It is therefore to be understood that within the scope of the appended claims the invention may be practiced otherwise than as specifically described.

What is claimed is:

1. In a motor system having a rotor, a magnetostrictive element and means for producing a cyclically pulsating magnetic field inducing axial deformation of the magnetostrictive element; a mechanism for converting the axial deformation of the magnetostrictive element into unidirectional angular movement of the rotor, comprising: rotatable transmitting means for imparting torque to the rotor, means responsive to relative angular displacement between the rotor and the transmitting means from a limit position for angularly biasing return of the transmitting means to said limit position, and clutch means responsive to said axial deformation of the magnetostrictive element for displacing the transmitting means from the limit position relative to the rotor to induce the torque imparted to the rotor.

2. The motor system as defined in claim 1 wherein said rotatable transmitting means includes:

a cam disc having a cam surface through which axial force applied is transformed into the torque imparted to the rotor and engageable stop elements respectively fixed to the rotor and the cam disc at locations defining said limit position.

3. The motor system as defined in claim 2 wherein said means for angularly biasing return of the transmitting means comprises: a spring element operatively interconnecting the rotor and the cam disc.

4. The motor system as defined in claim 3 wherein said clutch means comprises: a non-rotatable disc axially engageable by the magnetostrictive element and frictional interface means between said non-rotatable disc and the cam disc for transmitting the axial force applied thereto in response to said axial deformation of the magnetostrictive element.

5. In a motor system having a rotor, a magnetostrictive element and means for producing a cyclically pulsating magnetic field inducing axial deformation of the magnetostrictive element; a mechanism for converting the axial deformation of the magnetostrictive element into unidirectional angular movement of the rotor, comprising: a pair of engageable cam discs, one of said cam discs being fixed to the rotor and the other of the cam discs being axially displaceable relative thereto, stop means mounted on said cam discs for establishing an angular limit position therebetween at which transmittal of torque occurs in one direction during axial engagement of the cam discs, clutch means axially engageable with the axially displaceable cam disc for effecting said transmittal of the torque in response to said axial deformation of the magnetostrictive element, and spring means for yieldably holding the cam discs in the limit position.

6. In a motor system having a rotor, a magnetostrictive element and means for producing a cyclically pulsating magnetic field inducing axial deformation of the magnetostrictive element; a method of converting the axial deformation of the magnetostrictive element into movement of the rotor, comprising the steps of: transforming axial forces generated by said deformation of the magnetostrictive element into torque applied to the rotor inducing angular momentum thereof during power phases of operation; and controlling pulsations of the magnetic field to continue said movement of the rotor during periods of time between the power phases under the angular momentum induced.

7. The method as defined in claim 6 wherein said step of transforming the axial forces into the torque applied to the rotor includes: axial engagement of cam surfaces causing relative angular displacement therebetween against a yieldable bias; and angularly restoring the cam surfaces to a limit position under said yieldable bias during said periods of time between the power phases.

* * * * *